United States Patent [19]

Harrison

[11] 4,125,784
[45] Nov. 14, 1978

[54] FAIL-SAFE OR GATE

[75] Inventor: John R. Harrison, Gibsonia, Pa.

[73] Assignee: Westinghouse Air Brake Company, Swissvale, Pa.

[21] Appl. No.: 819,514

[22] Filed: Jul. 27, 1977

[51] Int. Cl.² .................... H03K 19/02; H03K 19/30
[52] U.S. Cl. .................................. 307/218; 307/363; 328/93; 331/55; 331/56; 331/117 R
[58] Field of Search .................. 307/218, 363; 328/93; 331/55, 56, 117 R

[56] References Cited
U.S. PATENT DOCUMENTS 3,422,284  1/1969  Martin .................................. 307/218

Primary Examiner—John Zazworsky
Attorney, Agent, or Firm—J. B. Sotak

[57] ABSTRACT

A fail-safe "OR" logic gate circuit which includes at least a first and a second level detector each of which has a voltage breakdown device and an oscillating circuit, a separate resonant tank circuit each of which is tuned to substantially the same frequency and being loosely coupled between each other, an amplifying circuit coupled to the output of each oscillating circuit, and a regulating-rectifying circuit coupled to the output of the amplifying circuit and producing a d.c. output signal when a d.c. input signal causes either or both of the voltage breakdown devices to break down and to exhibit a low impedance for causing the respective oscillating circuits to oscillate and supply a.c. signals to the amplifying circuit for rectification by the regulating-rectifying circuit.

10 Claims, 1 Drawing Figure

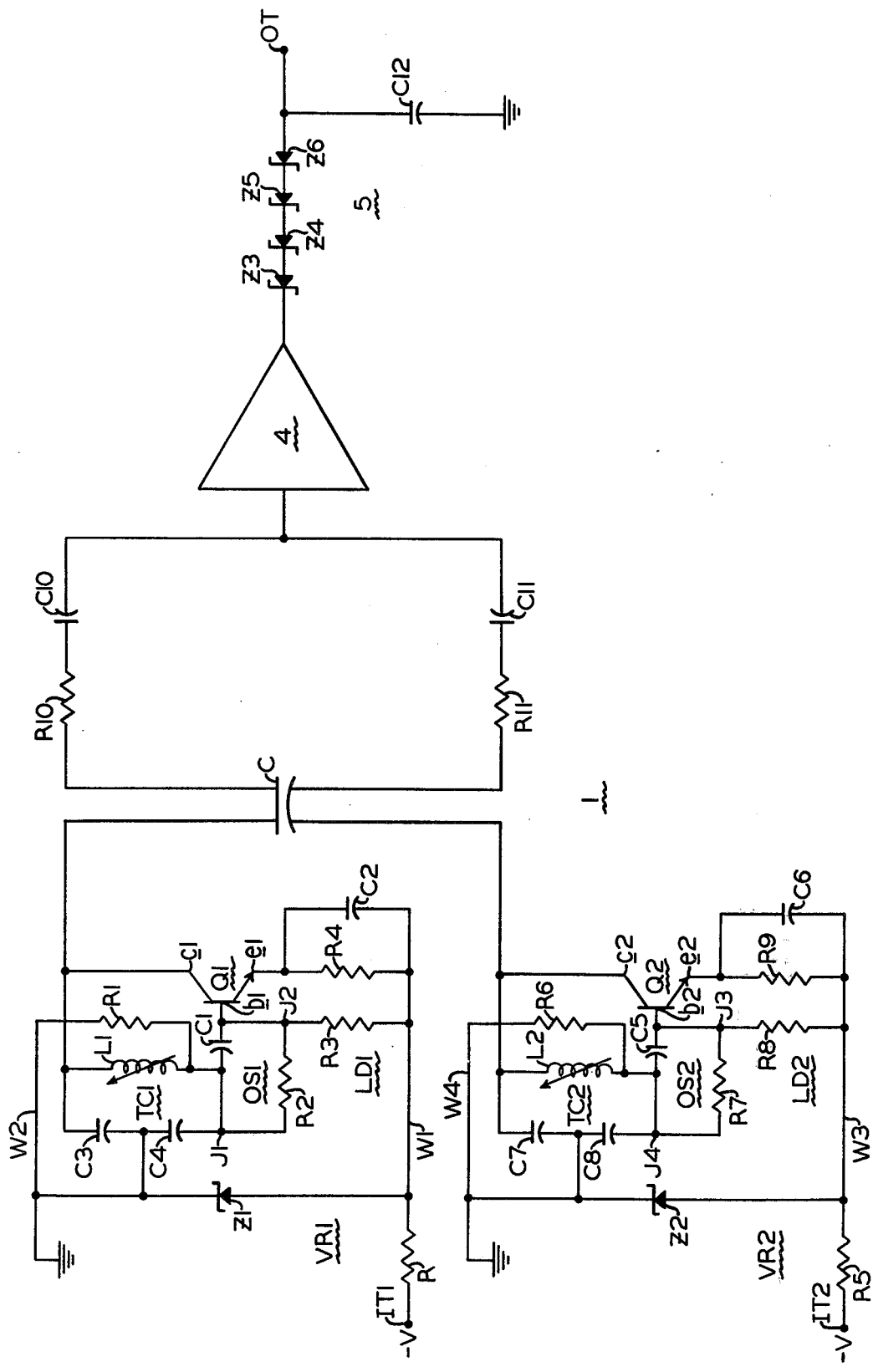

FAIL-SAFE OR GATE

FIELD OF THE INVENTION

This invention relates to a vital type of electronic logic circuit and, more particularly, to a fail-safe "OR" gate employing a pair of oscillating-type of semiconductor level detectors each of which includes a loosely coupled resonant tank circuit for determining a single frequency of oscillation when either one or both of the level detectors are energized and results in the production of a.c. oscillations which are amplified and rectified to produce an output voltage.

BACKGROUND OF THE INVENTION

It is well known that certain transistorized logic circuits are used extensively in digital computing, communications, control and data handling equipment as well as in other electronic systems and apparatus. For example, the presently disclosed solid-state logic circuit finds particular utility in a vital type of automatic vehicle speed control system for railroad and mass and/or rapid transit operations. In vehicular speed control systems of this type, it is of vital and utmost importance, and in many cases an authoritative requirement, to ensure that certain circuit sections or portions of the control system must operate in a fail-safe fashion. It will be appreciated that in fail-safe operation, a circuit malfunction or component failure must result either in a more restrictive condition or in a condition which is as safe as that preceding the failure.

While certain nonvital static gates, such as, "OR" logic circuits, are well known in the art, it is readily apparent that these conventional logic circuits are possessed of certain shortcomings which make their direct application to an automatic vehicle speed control system normally unacceptable and generally unsuitable for railroad and transit operation. For example, these standard nonvital solid-state "OR" gates operate in an unsafe manner in that a false output can be produced when a component or circuit failure occurs. The opening or short circuiting of an inductor, capacitor, resistor, diode, or transistor or the crossing or the loss of a lead or conductor can result in an erroneous output in an ordinary and conventional solid-state "OR" logic circuit. Further, a change or variation in the resistive, capacitive or inductive value of a component or element can cause a fluctuation in the amplitude of an output signal and can result in spurious signals. In one instance, it was found to be advantageous to utilize a plurality of vital level detectors of the oscillating type to make up an "OR" logic gate for a vehicle speed control system to determine if either of two inputs was present in the required amount. However, upon further experimentation, it was discovered that a problem occurred when two or more oscillating level detectors were separately or individually coupled to an amplifier gate. If both of the oscillating level detectors are turned on or rendered conductive, any difference in the frequencies of oscillations results in the production of a beat frequency. If the output of the "OR" gate is employed in a certain application, such as, in a vital vehicle speed control system, the introduction of the resultant low frequency beat signal into the system is wholly unacceptable and can cause an unsafe condition. Thus, it is mandatory in a fail-safe or vital speed control system to ensure that a beat frequency is not produced by a logic circuit employing a plurality of oscillating level detectors. Accordingly, it is necessary to ensure that unwanted beat signals are not produced when both oscillators are rendered conductive during the presence of both d.c. input signals.

OBJECTS OF THE INVENTION

Accordingly, it is an object of this invention to provide an improved fail-safe solid-state "OR" logic circuit.

Another object of this invention is to provide a unique vital "OR" gate employing a plurality of oscillating types of level detectors.

A further object of this invention is to provide a fail-safe "OR" gate utilizing a pair of oscillating level detectors, an amplifier gate and a regulating rectifier.

Yet another object of this invention is to provide a unique fail-safe logic circuit for producing an output signal when either a first input or a second input or both of the first and the second inputs are present.

Yet a further object of this invention is to provide a novel vital "OR" gate having a first and a second nonloading oscillating type of level detecting means supplying an a.c. input to an amplifying means for producing an output signal when an input signal is applied to either or both of the level detectors.

Still another object of this invention is to provide an improved fail-safe logic circuit having a pair of level detectors each of which includes a voltage breakdown device and an oscillating circuit being loosely coupled together to produce a single frequency a.c. output which is amplified and rectified to produce a d.c. supply voltage when either one or both of the level detectors are energized by d.c. input voltage.

Still a further object of this invention is to provide a vital logic circuit including at least a first and a second fail-safe level detector with each of the level detectors including a voltage breakdown device and an oscillating circuit, a separate frequency determining circuit connected to each of the oscillating circuits for determining the frequency of oscillations, a four-terminal capacitor loosely coupling the inputs of the oscillating circuits to an amplifying circuit, and a regulating rectifier being connectable to the amplifying circuit and being capable of only producing a d.c. output signal either when a d.c. input signal exceeds the breakdown voltage of one of the breakdown devices of the first and second level detectors or when d.c. input signals exceed the breakdown voltage of both of the breakdown devices of the first and second level detectors.

An additional object of this invention is to provide a new and improved "OR" logic gate which is simple in design, economical in cost, reliable in construction, durable in service, dependable in use and efficient in operation.

SUMMARY OF THE INVENTION

In accordance with this invention, there is provided a fail-safe "OR" logic gate for use in a vital vehicle speed control system for railroad and mass and/or rapid transit operation. The fail-safe "OR" gate includes a pair of electronic level detectors. Each of the electronic level detectors includes a shunt regulator and regenerative feedback oscillator. Each of the shunt regulators includes a current-limiting resistor and a Zener diode. One end of each of the current-limiting resistors is connected to separate terminals of suitable negative d.c. input signal sources while the other end of each of the resistors is connected to the anode electrode of the respective Zener diodes. The cathode electrode of each of the Zener diodes is connected to a reference potential, such as, ground. Each of the regenerative feedback oscillators includes a semiconductive amplifier stage having an NPN transistor. The transistor forms the active element of a Colpitts type of oscillator. Each of the transistor oscillators includes a biasing circuit which provides d.c. operating voltages to the transistor electrodes from the respective current-limiting resistors. A separate substantially identical L-C resonant tank circuit is coupled to each transistor oscillator for determining the frequency of oscillation. The output of each of the transistor oscillators is loosely coupled by a four-terminal capacitor to the input of a solid-state power amplifier via a series connected resistor and capacitor. The output of the power amplifier is connected to a regulating rectifier which includes a plurality of series Zener diodes and a shunt filtering capacitor. Accordingly, when a negative d.c. input signal voltage is applied to either or both of the input current-limiting resistors, one or both of the Zener diodes will break down and conduct. The conduction of the respective Zener diodes causes the necessary d.c. operating potentials to be supplied to the respective transistor oscillator and establishes a low impedance feedback path which causes either or both to go into oscillation. The frequency of the a.c. oscillations is determined by the inductance and capacitance values of each of the L-C resonant tank circuits which remains unloaded due to the four-terminal capacitor interconnecting each of the transistor oscillators. Thus, the frequency of the a.c. oscillations will be the same if either one or both of the transistor oscillators are rendered conductive by the presence of the associated negative d.c. input voltage. The a.c. oscillations are conveyed by the series resistor and capacitor to the input of the power amplifier which amplified and feeds to a.c. signals to the regulating rectifier. A plurality of series connected Zener diodes rectify the amplified a.c. signal to produce a negative d.c. output signal when either or both d.c. input signals are present.

BRIEF DESCRIPTION OF THE DRAWING

Other objects, features, and advantages of this invention will become more readily apparent from the following description of the preferred embodiment when read with reference to and considered in conjunction with the accompanying drawing which forms a part of this specification, in which:

The single FIGURE in the drawing is a schematic circuit diagram of a fail-safe solid-state "OR" circuit in accordance with the present invention.

Referring now to the single FIGURE of the drawing, there is shown a vital-type of a two-input electronic "OR" gate circuit, generally characterized by numeral 1, which includes a pair of loosely coupled level detectors or detecting means LD1 and LD2, a power amplifier or amplifying means 4 and an output regulating rectifier or output means 5.

It will be appreciated that the present invention has evolved as a result of the inability to safely utilize any of the conventional nonvital types of "OR" gates in a fail-safe vehicular speed control system. Specifically, oscillating types of the prior art logic circuits have certain shortcomings which do not conform with fail-safe practices and principles. The fail-safe "OR" logic circuit of the present invention may be broadly considered as a two-input signal passing gate. That is, when either or both of a pair of input signals are present, an output signal is produced, and when neither of the pair of input signals is present, no output signal should exist. As will become more readily apparent hereinafter, it is necessary to make certain that under no circumstance will a false or erroneous output exist when a circuit or component fails. That is, in order to provide fail-safe operation, it is essential that a false output signal is incapable of being produced when a component or circuit malfunction occurs.

Turning now to the details of the vital logic circuit, it will be seen that the "OR" gate 1 includes two separate input terminals IT1 and IT2 and an output terminal OT. It will be understood that the number of inputs may be obviously increased if needed and that the input voltages or signals applied to terminals IT1 and IT2 are negative d.c. signals $-V$ of a sufficient amplitude which exceeds the breakdown or avalanche value of a Zener diode, as will be explained hereinafter.

As shown, the first level detector LD1, which may be of the type shown and described in U.S. Pat. No. 3,737,806, to John O. G. Darrow and is assigned to the same assignee as the subject application, includes a shunt voltage regulator VR1 having a current-limiting resistor R and a voltage breakdown device or Zener diode Z1. It will be observed that one end of resistor R is connected to the first negative voltage input terminal IT1 of a suitable source of potential (not shown) while the other end of resistor R is connected to the anode of Zener diode Z1 and to the negative voltage lead or wire W1. The cathode electrode of Zener diode Z1 is connected to a reference potential or ground via lead W2. The voltage regulator VR1 supplies the necessary operating and biasing potentials for the Colpitts type of solid-state oscillator OS1 of the first level detector LD1. The regulated voltage developed across Zener diode Z1 is applied to a voltage divider including resistors R1, R2 and R3. It will be seen that the upper end of resistor R1 is connected to ground lead W2 while the lower end of resistor R3 is connected to the negative voltage lead W1. It will be observed that the intermediate resistor R2 has its upper end connected to the lower end of resistor R1 thereby forming junction point J1. Similarly, the lower end of resistor R2 is connected to the upper end of resistor R3 thereby forming junction point J2. The Colpitts oscillator OS1 includes a solid-state device or NPN transistor Q1 having a common emitter electrode $e1$, an output collector electrode $c1$ and an input base electrode $b1$. As shown, the base electrode $b1$ is directly connected to the junction point J2 formed between voltage dividing resistors R2 and R3 and also is connected to junction point J1 via capacitor C1. The emitter electrode $e1$ is connected to the negative lead W1 via resistor R4 which is shunted by a by-pass capacitor C2. The output collector electrode $c1$ is connected to one end of a tuned tank or parallel resonant circuit TC1. The tuned circuit TC1 includes a variable inductor L1 and a pair of series connected capacitors C3 and C4. The upper plate of capacitor C3 is connected to the upper end of inductor L1 while the lower plate of capacitor C3 is connected to the junction point J1 which is common to the lower end of inductor L1. The common junction point formed between the capacitors C3 and C4 is connected to the cathode electrode of Zener diode Z1 which is grounded. The tank circuit TC1 is tuned to a preselected or predetermined frequency which is determined by the capacitance and inductance values of capacitors C3 and C4 and inductor L1.

As shown, the second level detector LD2, which may also be of the type disclosed in the above-mentioned Darrow patent, includes a shunt voltage regulator VR2 having a current-limiting resistor R5 and a voltage breakdown device or Zener diode Z2. It will be observed that one end of resistor R5 is connected to the second negative voltage input terminal IT2 while the other end of resistor R5 is connected to the anode electrode of Zener diode Z2 and to the negative voltage lead or wire W3. The cathode electrode of Zener diode Z2 is directly connected to ground lead W4. The voltage regulator VR2 supplies the necessary operating and biasing voltages for the second Colpitts oscillator OS2. The regulated voltage developed across Zener diode Z2 is applied to a voltage dividing network consisting of resistors R6, R7 and R8. It will be seen that the upper end of resistor R6 is connected to ground lead W4 while the lower end of resistor R8 is connected to the negative voltage lead W3. The Colpitts oscillator OS2 includes an NPN amplifying transistor or semiconductor device Q2 having a common emitter electrode $e2$, an output collector electrode $c2$ and an input base electrode $b2$. As shown, the base electrode $b2$ is directly connected to the junction point J3 formed between the series-connected resistors R7 and R8. The emitter electrode $e2$ is connected to the negative voltage lead W3 via resistor R9 which is shunted by a by-pass capacitor C6. The base electrode $b2$ is connected to a junction point J4 formed between biasing resistors R6 and R7 via capacitor C5.

The frequency determining means or tuned network which is substantially identical to tank circuit TC1 also takes the form of a parallel resonant or tank circuit TC2 which is tuned to substantially the same predetermined frequency as network TC1 by a pair of series-connected capacitors C7 and C8 coupled in parallel with a variable inductor L2. As shown, the upper end of the tank circuit TC1 is directly connected to the collector electrode $c2$ while the lower end of the tank circuit TC1 is connected to the junction point J4 which as mentioned above is connected to the input base electrode $b2$ via signal passing capacitor C5. The junction point between capacitors C7 and C8 is directly connected to the cathode electrode of Zener diode Z2 which is grounded.

As shown, the tank circuit TC2 of oscillator OS2 is also connected to the tank circuit TC1 of oscillator OS1 via fourterminal capacitor C. That is, the upper end of tank circuit TC1 which is common to the output collector electrode $c1$ is connected to the upper plate of the coupling capacitor C while the upper end of the tank circuit TC2 which is common to output collector electrode $c2$ is connected to the lower plate of the coupling capacitor C. The electrostatic coupling between the two resonant circuits TC1 and TC2 is dependent upon the reactance or reactive impedance of capacitor C. When there is little coupling between two circuits tuned to the same frequency, each behaves much like the other were not present. Thus, the capacitor C loosely couples each tank circuit so that each circuit does not load the other. This nonloading effect does not permit an increase in the series resistance in each tuned circuit, and hence the sharpness of resonance or selectivity is not decreased.

The a.c. oscillations or signals are conveyed by capacitor C to the input of the solid-state power amplifier 4 via a resistor R10 and a series connector capacitor C10 or a resistor R11 and a series connected capacitor C11. That is, the left-hand end of resistor R10 is connected to the upper plate of the capacitor C while the left-hand end of resistor R11 is connected to the lower plate of the four-terminal capacitor C. As shown, the right-hand ends of capacitors C10 and C11 are connected to a common point forming the input to amplifier 4. The amplified a.c. signals derived from transistor amplifier 4 which may include an emitter-follower stage and a grounded-emitter stage are fed to the regulating rectifier network 5. The regulating rectifier 5 includes a plurality of series-connected Zener diodes Z3, Z4, Z5 and Z6 and a filtering capacitor C12. As shown, the cathode electrode of Zener diode Z3 is directly connected to the output of the power amplifier 4 while the anode electrode of diodes Z3, Z4 and Z5 are connected to the cathode of diodes Z4, Z5 and Z6, respectively. The junction point between the anode electrode of Zener diode Z6 and the upper plate of capacitor C12 forms the output terminal OT while the lower plate of capacitor C12 is connected to ground potential. In practice, the negative voltage appearing on terminal OT is supplied to a fail-safe electronic limiting circuit or solid-state limiter which is part of the vital vehicle speed control system. It will be appreciated that the number of Zener diodes may be increased or decreased depending on their ratings and the magnitude of the voltage required by the load. The purpose of connecting a number of Zener diodes in series is to allow for a stable voltage to be obtained over a wide range of temperature variations. In fact, the Zener diodes have been selected to have the same temperature drift as the other temperature sensitive components of the logic circuit 1.

Turning now to the operation of the fail-safe "OR" gate 1, it will be assumed that the components are in tact and functioning properly and that no negative d.c. input voltage is applied to either input terminal IT1 or input terminal IT2. Under such an assumption, no d.c. output signal is present on terminal OT since neither of the oscillators is energized.

Let us now assume that a negative d.c. voltage of a sufficient level is applied to the first input terminal IT1. Under this condition, the magnitude of the negative input voltage is large enough to break down and render the Zener diode Z1 conductive so that it exhibits a low dynamic impedance. The regulated voltage developed across Zener diode Z1 remains substantially constant over a wide range of voltage and current variations and provides the various biasing and operating potentials by the voltage dividing resistors R1, R2 and R3 for ensuring stable operation of the transistor oscillator OS1. With the Zener diode Z1 conducting, a low impedance path is established from the junction point between capacitors C3 and C4, through the Zener diode Z1, through lead W1, through signal by-pass capacitor C2 to the emitter electrode $c1$. The circuit path is completed by coupling capacitor C1 which is connected between the junction point J1 or the lower end of the tank circuit TC1 and the base electrode $b1$. Accordingly, sufficient regenerative feedback is now provided for the transistor oscillator OS1 so that a.c. oscillations having a frequency determined by the tank circuit TC1 are generated and appear on collector electrode $c1$. As is well known, the amplitude of the a.c. signals developed on the collector electrode $c1$ is a function of the gain of the amplifier transistor Q1 minus the feedback signals. It will be seen that the a.c. oscillations on the collector electrode $c1$ are coupled to the input of the power amplifier 4 via coupling capacitor C and series resistor R10 and capacitor C10. After being amplified by the power amplifier 4, the a.c. signals are fed to rectifier 5 for conversion to a regulated d.c. output voltage. Thus, a negative d.c. output voltage is developed on terminal OT when a negative d.c. input signal having a level which exceeds the Zener breakdown voltage of diode Z1 is delivered to input terminal IT1.

Similarly, let us now assume that a negative d.c. input signal appears on input terminal IT2 rather than an terminal IT1. When the d.c. input voltage exceeds the threshold value of the voltage breakdown device, the Zener diode Z2 conducts and presents a low impedance regenerative feedback path for transistor oscillator OS2. The Zener diode Z2 provides the required d.c. biasing and operating voltages for the oscillator OS2 in addition to providing the necessary a.c. feedback circuit for sustaining the a.c. oscillations. Actually, the feedback path extends from the junction point between capacitors C7 and C8 of the tank circuit TC2, through Zener diode Z2, through lead W3 and through signal by-pass capacitor C6 to the emitter electrode $e2$ of transistor Q2 through emitter-base junction and then from the base electrode $b2$, through coupling capacitor C5 to the junction point J4 or the lower end of the tank circuit TC2. Thus, the transistor oscillator OS2 goes into oscillation and produces a.c. signals having a frequency determined by LC characteristics of the tank circuit TC2. It will be appreciated that the a.c. signals developed on the collector $c2$ of transistor Q2 are delivered to the input of power amplifier 4 via coupling capacitor C and the series-connected resistor R11 and capacitor C11. After amplification, the a.c. output signals are fed to rectifier 5 which converts the a.c. voltage to a regulated negative d.c. voltage. As mentioned above, the negative d.c. voltage developed on output terminal OT is employed to power a suitable voltage limiter which forms part of the vehicle speed control system.

Now, when a negative d.c. input voltage of a sufficient level is applied to both of the input terminals IT1 and IT2, both of the level detectors 2 and 3 will be rendered conductive and result in the production of a.c. signals, each of which will have the same frequency due to the loose coupling exhibited by capacitor C which interconnects frequency determining resonant tank circuit TC1 and TC2. That is, when the two Zener diodes Z1 and Z2 are rendered conductive by the presence of both input voltages −V on terminals IT1 and IT2, the necessary biasing and operating potentials are supplied to the transistors Q1 and Q2. Accordingly, a.c. signals having identical frequencies are developed on the collector electrodes $c1$ and $c2$ of each transistor Q1 and Q2. The a.c. signals are conveyed via coupling capacitor C and series connected resistor R10 and capacitor C10 as well as series connected resistor R11 and capacitor C11 to amplifier 4 and, in turn, to rectifier 5 for the development of a regulated negative d.c. output on terminal OT. While in the present case, the d.c. output is applied to the input of a limiting circuit it will be understood that the a.c. signals from amplifier 4 may be directly used to energize an a.c. load, and thus output terminal of the amplifier may be employed as an output means.

Thus, a d.c. output voltage is produced by the fail-safe "OR" logic gate 1 when either or both of the input signals are present. That is, a negative d.c. output signal is only available at terminal OI when the applied d.c. voltage on either or both terminals IT1 and IT2 is of a sufficient amplitude to cause either or both Zener diodes Z1 and Z2 to become conductive and assume its low dynamic impedance condition.

It will be appreciated that the unique characteristics of the Zener diodes prevent a short circuit or open circuit from adversely affecting the vitality of the "OR" logic gate 1. Further, a leaky Zener diode fails in a safe manner in that a relatively high dynamic impedance accompanies a conducting Zener diode which avalanches at a reduced level.

In addition, the unsafe failure of the other components or elements of the gating circuit results in the deterioration of the necessary amplification or oscillating qualities or causes the loss of circuit integrity or rectification. The use of a four-terminal capacitance element for capacitor C ensures that the loss of any lead or connection will not have a deterious affect on the operation of the fail-safe logic circuit 1. That is, the loss of a lead or connection will not interrupt the connection to the amplifier 4 from one or the other of the level detectors which is a safe condition. Accordingly, it will be appreciated that the presently described "OR" logic gate operates in a fail-safe manner in that an erroneous or untrue output signal is incapable of being produced to result in an unsafe failure.

It will be understood that while this invention finds particular utility in a vehicle speed control system, it is readily evident that the invention is not merely limited thereto but may be employed in various other systems and apparatus which require the safety and security inherent in the invention. But regardless of how or where the invention is used, it will be appreciated that various changes may be made by persons skilled in the art without departing from the spirit and scope of the invention. It will also be apparent that other alterations and modifications can be made in the presently described invention and, therefore, it is understood that all changes, equivalents and deviations within the spirit and scope of this invention are herein meant to be included in the appended claims.

Having thus described my invention, what I claim as new and desire to secure by Letters Patent, is:

1. A vital logic circuit comprising at least a first and a second fail-safe level detecting means, each of said first and said second fail-safe level detecting means including a voltage breakdown device and an oscillating circuit, an impedance means loosely coupling the frequency determining circuit of each of said oscillating circuits, an amplifying means coupled to each of said oscillating circuits, and means connected to said amplifying circuit and having an output signal developed thereon either when a d.c. input signal exceeds the breakdown voltage of one of said breakdown devices of said first and second fail-safe level detecting means or when a d.c. input signal exceeds the breakdown voltages of both of said breakdown devices of said first and said second fail-safe level detecting means.

2. The vital logic circuit as defined in claim 1, wherein each of said frequency determining circuits is an L-C tank circuit.

3. The vital logic circuit as defined in claim 1, wherein said first oscillating circuit includes a common-emitter Colpitts oscillators.

4. The vital logic circuit as defined in claim 1, wherein said second oscillating circuit includes a common-emitter Colpitts oscillator.

5. The vital logic circuit as defined in claim 1, wherein a current-limiting resistor is connected in series with each of said voltage breakdown devices of said first and second fail-safe level detecting means.

6. The vital logic circuit as defined in claim 1, wherein said impedance means loosely coupling said frequency determining circuits is a four-terminal capacitor.

7. The vital logic circuit as defined in claim 1, wherein said means includes a regulating rectifier voltage breakdown means and a capacitance means.

8. The vital logic circuit as defined in claim 1, wherein each of said oscillating circuits of said first and second fail-safe level detecting means includes a PNP transistor.

9. The vital logic circuit as defined in claim 1, wherein said frequency determining circuit is a parallel resonant network.

10. The vital logic circuit as defined in claim 1, wherein a series resistor and capacitor couples each of said oscillating circuits to said amplifying means.

* * * * *